(12) United States Patent
Zhao et al.

(10) Patent No.: US 11,296,303 B2
(45) Date of Patent: Apr. 5, 2022

(54) FLEXIBLE DISPLAY AND METHOD OF FABRICATING SAME

(71) Applicant: WUHAN CHINA STAR OPTOELECTRONICS SEMICONDUCTOR DISPLAY TECHNOLOGY CO., LTD., Hubei (CN)

(72) Inventors: Chen Zhao, Hubei (CN); Haochun Lee, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 199 days.

(21) Appl. No.: 16/634,323

(22) PCT Filed: Mar. 8, 2019

(86) PCT No.: PCT/CN2019/077426
§ 371 (c)(1),
(2) Date: Jan. 27, 2020

(87) PCT Pub. No.: WO2020/151058
PCT Pub. Date: Jul. 30, 2020

(65) Prior Publication Data
US 2021/0226160 A1 Jul. 22, 2021

(30) Foreign Application Priority Data
Jan. 25, 2019 (CN) .......................... 201910073648.4

(51) Int. Cl.
*H01L 51/52* (2006.01)
*G06F 3/041* (2006.01)
*H01L 27/32* (2006.01)

(52) U.S. Cl.
CPC ........ *H01L 51/5253* (2013.01); *G06F 3/0412* (2013.01); *H01L 27/323* (2013.01); *G06F 2203/04102* (2013.01); *G06F 2203/04103* (2013.01); *H01L 2251/5338* (2013.01)

(58) Field of Classification Search
CPC ............................................. H01L 2251/5338
See application file for complete search history.

(56) References Cited

U.S. PATENT DOCUMENTS

| 10,622,417 | B2 | 4/2020 | Chen |
| 2007/0263873 | A1 | 11/2007 | Qi et al. |
| 2014/0183478 | A1 | 7/2014 | Lee et al. |
| 2017/0263873 | A1 | 9/2017 | Zhang et al. |

FOREIGN PATENT DOCUMENTS

| CN | 202533921 U | 11/2012 |
| CN | 106527805 A | 3/2017 |
| CN | 107994129 A | 5/2018 |
| CN | 108021284 A | 5/2018 |
| CN | 108363135 A | 8/2018 |
| CN | 207817243 U | 9/2018 |

*Primary Examiner* — Vip Patel (57) ABSTRACT

A flexible display and a method of fabricating same are provided. The flexible display integrates at least two of a flexible display panel, a touch function member, a polarizing member, and a protective cover in the flexible display. It is not necessary to use optical glue or the like to connect components that are integrated, thereby reducing a thickness of the flexible display and alleviating a technical problem that a current display device has a large thickness.

14 Claims, 5 Drawing Sheets

FLEXIBLE DISPLAY AND METHOD OF FABRICATING SAME

FIELD OF INVENTION

The present disclosure relates to the field of display technologies, and more particularly to a flexible display and a method of fabricating same.

BACKGROUND OF INVENTION

With the development of display technologies, there are higher requirements for display devices. Organic light emitting diode (OLED) displays have advantages of being lighter, thinner, and more flexible than liquid crystal displays, and have a wide range of applications.

Figure 1:
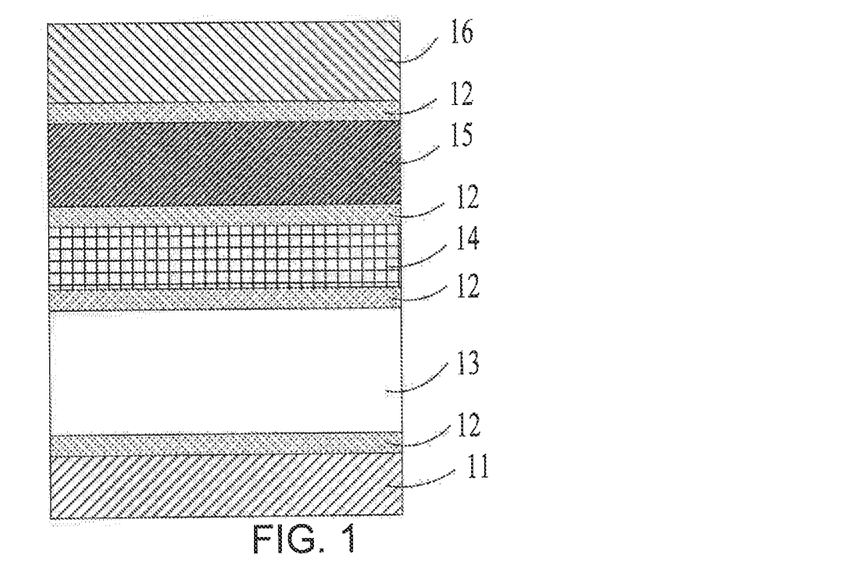
FIG. 1 is a schematic diagram of a film layer of a current display.

A structure of a current flexible display is as illustrated in FIG. 1. The current flexible display includes a cover plate 16, a polarizer 15, a touch layer 14, an OLED display panel 13, and a back plate 11. Connection between layers needs to be bonded using an optically clear adhesive (OCA) 12, such that a thickness of an OLED display is large.

Therefore, the current flexible display has a technical problem of a large thickness and needs to be improved.

SUMMARY OF INVENTION

The present disclosure provides a flexible display and a method of fabricating same to alleviate a technical problem of a large thickness of a current display device.

To solve the above issues, a technical solution provided by the present disclosure is as follows.

An embodiment of the present disclosure provides a flexible display. The flexible display includes a flexible display panel, a touch function member, a polarizing member, and a protective cover. The touch function member is disposed on a light emitting direction of the flexible display panel. The polarizing member is disposed in a direction in which the touch function member is away from the flexible display panel. At least two of the flexible display panel, the touch function member, the polarizing member, and the protective cover are integrally disposed.

In an embodiment of the present disclosure, the flexible display further includes a back plate, and the flexible display panel is disposed on the back plate.

In an embodiment of the present disclosure, the polarizing member and the protective cover are integrally disposed to form a polarizing protection member, an adhesive is disposed between the flexible display panel and the back plate, an adhesive is disposed between the touch function member and the flexible display panel, and an adhesive is disposed between the polarizing protection member and the touch function member.

In an embodiment of the present disclosure, the polarizing protection member includes a polarizing layer, a hardened layer, and a flexible layer, the hardened layer is disposed in a direction in which the flexible layer is away from the flexible display panel, and the polarizing layer is formed on a surface of the flexible layer.

In an embodiment of the present disclosure, the polarizing layer is formed in a direction in which the flexible layer is away from the hardened layer, or the polarizing layer is formed between the flexible layer and the hardened layer.

In an embodiment of the present disclosure, the polarizing protection member includes a polarizing layer and a hardened layer, the polarizing layer is formed on a surface of the hardened layer facing the flexible display panel.

In an embodiment of the present disclosure, the touch function member and the flexible display panel are integrally disposed, an adhesive is disposed between the flexible display panel and the back plate, an adhesive is disposed between the polarizing member and the touch function member, and an adhesive is disposed between the protective cover and the polarizing member.

In an embodiment of the present disclosure, the polarizing member and the touch function member are integrally disposed, an adhesive is disposed between the flexible display panel and the back plate, an adhesive is disposed between the touch function member and the flexible display panel, and an adhesive is disposed between the protective cover and the polarizing member.

In an embodiment of the present disclosure, the polarizing member and the protective cover are integrally disposed to form a polarizing protection member, the touch function member and the flexible display panel are integrally disposed, an adhesive is disposed between the flexible display panel and the back plate, and an adhesive is disposed between the polarizing protection member and the touch function member.

In an embodiment of the present disclosure, the polarizing member and the protective cover are integrally disposed to form a polarizing protection member, the touch function member and the polarizing protection member are integrally disposed, an adhesive is disposed between the flexible display panel and the back plate, and an adhesive is disposed between the touch function member and the flexible display panel.

In an embodiment of the present disclosure, the polarizing protection member includes a polarizing layer, a hardened layer, and a flexible layer, the hardened layer is disposed in a direction in which the flexible layer is away from the flexible display panel, the polarizing layer is formed in a direction in which the flexible layer is away from the hardened layer, and the touch function member is formed in a direction in which the polarizing layer is away from the hardened layer.

In an embodiment of the present disclosure, the polarizing protection member includes a polarizing layer, a hardened layer, and a flexible layer, the hardened layer is disposed in a direction in which the flexible layer is away from the flexible display panel, the polarizing layer is formed between the flexible layer and the hardened layer, and the touch function member is formed in a direction in which the flexible layer is away from the hardened layer.

In an embodiment of the present disclosure, the polarizing protection member includes a polarizing layer and a hardened layer, the polarizing layer is formed on a surface of the hardened layer facing the flexible display panel, and the touch function member is formed in a direction in which the polarizing layer is away from the hardened layer.

In an embodiment of the present disclosure, the polarizing member, the touch function member, and the flexible display panel are integrally disposed, an adhesive is disposed between the flexible display panel and the back plate, and an adhesive is disposed between the protective cover and the polarizing member.

In an embodiment of the present disclosure, the polarizing member and the protective cover are integrally disposed to form a polarizing protection member, the polarizing protection member, the function touch member, and the flexible display panel are integrally disposed, and an adhesive is disposed between the flexible display panel and the back plate.

In an embodiment of the present disclosure, the polarizing protection member includes a polarizing layer and a hardened layer, and the polarizing layer is formed on a surface of the hardened layer facing the flexible display panel.

In an embodiment of the present disclosure, the protective cover, the polarizing member, the touch function member, the flexible display panel, and the back plate are integrally disposed.

In an embodiment of the present disclosure, the protective cover and the polarizing member are integrally disposed to form a polarizing protection member, and the polarizing protection member, the touch function member, and the flexible display panel are integrally disposed.

In an embodiment of the present disclosure, the polarizing protection member includes a polarizing layer and a hardened layer, and the polarizing layer is formed on a surface of the hardened layer facing the flexible display panel.

An embodiment of the present disclosure provides a method of fabricating a flexible display including providing a flexible display panel, providing a touch function member in a light emitting direction of the flexible display panel, providing a polarizing member in a direction in which the touch function member is away from the flexible display panel, and providing a protective cover. At least two of the flexible display panel, the touch function member, the polarizing member, and the protective cover are integrally disposed.

Beneficial effects of the embodiment of present disclosure are that, the embodiment of the present disclosure provides a flexible display and a method of fabricating same. The flexible display includes a flexible display panel, a touch function member, a polarizing member, and a protective cover. The touch function member is disposed on a light emitting direction of the flexible display panel. The polarizing member is disposed in a direction in which the touch function member is away from the flexible display panel. At least two of the flexible display panel, the touch function member, the polarizing member, and the protective cover are integrally disposed. The flexible display integrates at least two of the flexible display panel, the touch function member, the polarizing member, and the protective cover in the flexible display. It is not necessary to use optical glue or the like to connect components that are integrated, thereby reducing a thickness of the flexible display and alleviating a technical problem that a current display device has a large thickness.

DESCRIPTION OF DRAWINGS

The accompanying figures to be used in the description of embodiments of the present disclosure or the prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Technical solutions in implementation plans and/or embodiments of the present disclosure will be clearly and completely described below in conjunction with specific embodiments of the present disclosure. It is obvious that the implementation plans and/or the embodiments described below are only a part of the implementation plans and/or the embodiments of the present disclosure, and not all implementation plans and/or embodiments. All other implementation plans and/or embodiments obtained by a person of ordinary skill in the art based on the implementation plans and/or the embodiments of the present disclosure without prior inventive work are all within the scope of the present disclosure.

Directional terms mentioned in this present disclosure, such as upper, lower, left, right, front, back, inside, outside, side, etc., are only references are only directions by referring to the accompanying drawings. Therefore, the directional terms used are for the purpose of illustration and understanding of the present disclosure and are not intended to be limiting of the present disclosure. Terms "first", "second" and the like are used for descriptive purposes only and are not to be understood as indicating or implying their relative importance or implicitly indicating the number of technical features indicated. Thus, features defining "first", "second", etc. may include one or more of the features, either explicitly or implicitly.

The embodiment of the present disclosure can alleviate issues in view of a technical problem that a current display device has a large thickness.

In an embodiment, as illustrated in FIG. 2 to FIG. 9, a flexible display provided by an embodiment of the present disclosure includes a flexible display panel 23, a touch function member 24, a polarizing member 25, and a protective cover 26. The touch function member 24 is disposed on a light emitting direction of the flexible display panel. The polarizing member is disposed in a direction in which the touch function member is away from the flexible display panel. At least two of the flexible display panel, the touch function member, the polarizing member, and the protective cover are integrally disposed.

The embodiment of the present disclosure provides a flexible display. The flexible display includes a flexible display panel, a touch function member, a polarizing member, and a protective cover. The touch function member is disposed on a light emitting direction of the flexible display panel. The polarizing member is disposed in a direction in which the touch function member is away from the flexible display panel. At least two of the flexible display panel, the touch function member, the polarizing member, and the protective cover are integrally disposed. The flexible display integrates at least two of the flexible display panel, the touch function member, the polarizing member, and the protective cover in the flexible display. It is not necessary to use optical glue or the like to connect components that are integrated, thereby reducing a thickness of the flexible display and alleviating a technical problem that a current display device has a large thickness.

Figure 2:
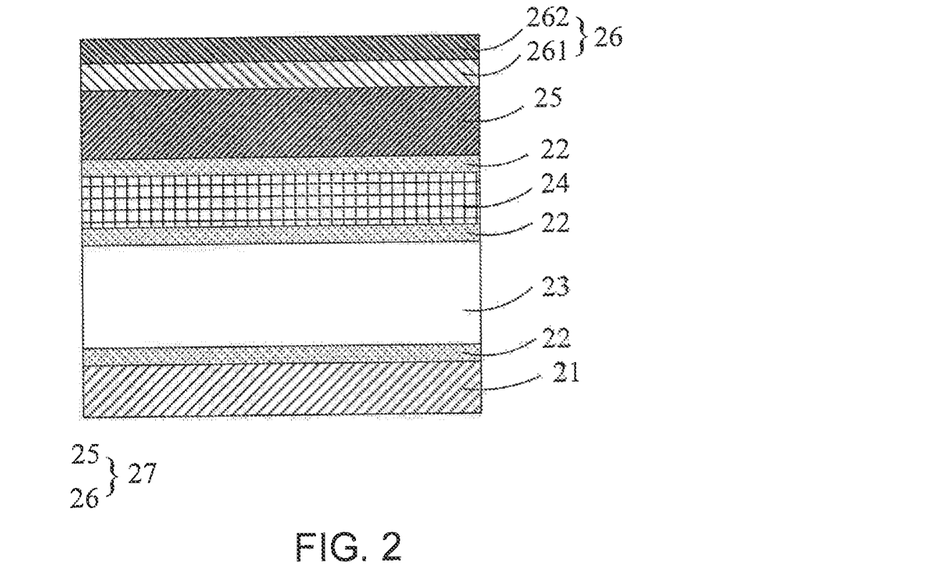
FIG. 2 is a schematic diagram of a first film layer of a flexible display according to an embodiment of the present disclosure.
Figure 3:
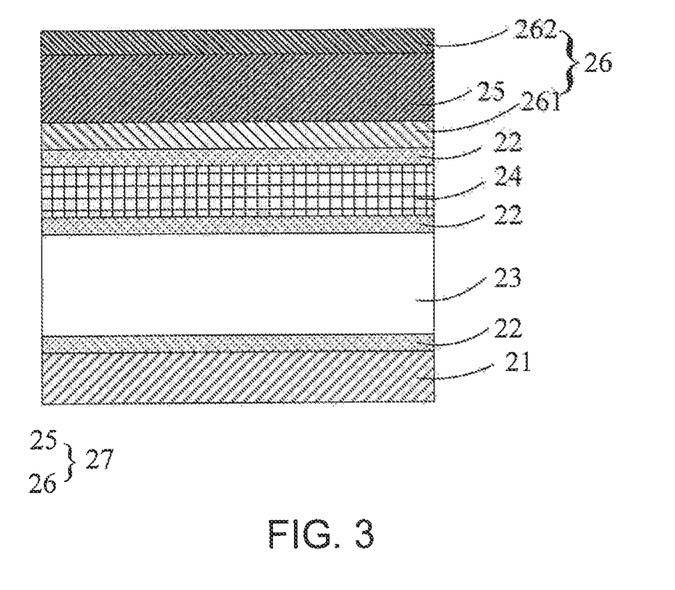
FIG. 3 is a schematic diagram of a second film layer of a flexible display according to an embodiment of the present disclosure.
Figure 4:
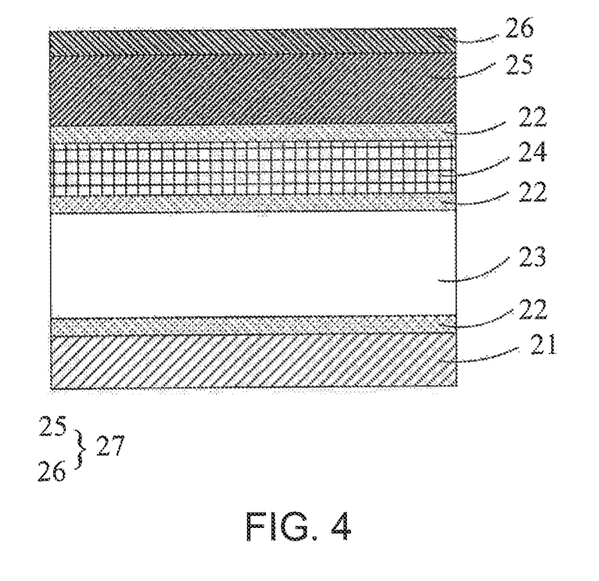
FIG. 4 is a schematic diagram of a third film layer of a flexible display according to an embodiment of the present disclosure.

In an embodiment, as illustrated in FIG. 2, FIG. 3 and FIG. 4, the embodiment of the present disclosure provides the flexible display including a back plate 21, the flexible display panel 23, the touch function member 24, the polarizing member 25, and the protective cover 26. The polarizing member 25 and the protective cover 26 are integrally disposed to form a polarizing protection member 27. An adhesive 22 is disposed between the back plate 21 and the flexible display panel. The adhesive 22 is disposed between the flexible display panel and the touch function member. The adhesive 22 is disposed between the touch function member and the polarizing member. The polarizing member and the protective cover are integrally disposed, such that no adhesive connection is required between the polarizing member and the protective cover, thereby reducing a thickness of the flexible display.

In one embodiment, as illustrated in FIG. 2, the polarizing protection member 27 includes a polarizing layer 25, a flexible layer 261, and a hardened layer 262, the hardened layer 262 is disposed in a direction in which the flexible layer is away from the flexible display panel. The polarizing layer 25 is disposed in a direction in which the flexible layer 261 is away from the hardened layer.

In one embodiment, as illustrated in FIG. 3, the polarizing protection member 27 includes a polarizing layer 25, a flexible layer 261, and a hardened layer 262, and the hardened layer 62 is disposed in a direction in which the flexible layer 261 is away from the flexible display panel. The polarizing layer 25 is formed between the flexible layer 261 and the hardened layer 262.

In the embodiment of the present disclosure, the polarizing protection member is formed by integrally providing the polarizing member and the protective cover, such that the polarizing member and the protective cover are not required to be connected using an adhesive, and the polarizing layer can be formed under the flexible layer, and can also be formed between the flexible layer and the hardened layer, thereby reducing the thickness of the flexible display.

In one embodiment, as illustrated in FIG. 4, the protective cover 26 is a hardened layer, and the polarizing member 25 is integrated with the protective cover 26 to form a polarizing protection member 27. The polarizing protection member 27 includes a polarizing layer 23 and a hardened layer 26. The polarizing layer 23 is formed on a direction of the hardened layer 26 facing the flexible display panel 23. The protective cover 26 is hardened by removing the flexible layer in the protective cover 26. The protective cover and the polarizing member are integrally disposed to form a polarizing protection member, which further reduces the thickness of the flexible display.

Figure 5:
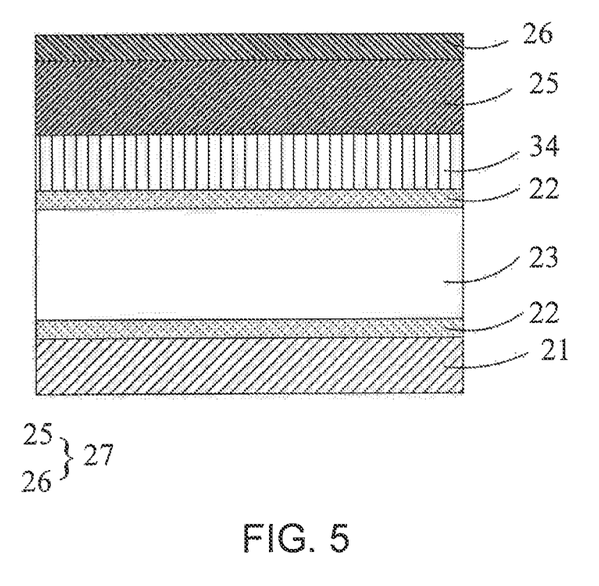
FIG. 5 is a schematic diagram of a fourth film layer of a flexible display according to an embodiment of the present disclosure.

In order to further reduce the thickness of the display, the present disclosure provides the following embodiments. As illustrated in FIG. 5, the embodiment of the present disclosure provides a flexible display including a back plate 21, a flexible display panel 23, a touch function member 34, a polarizing member 25, and a protective cover 26, The polarizing member 25 and the protective cover 26 are integrally disposed to form a polarizing protection member 27. The polarizing protection member 27 and the touch function member 34 are integrally disposed, and the touch function member 34 is integrally disposed. An adhesive 22 is disposed between the touch function member 34 and the flexible display panel 23, and the adhesive 22 is disposed between the flexible display panel 23 and the back plate 21. The protective cover, the polarizing protection member, and the touch function member are integrally disposed, such that the protective cover, the polarizing protection member, and the touch function member are not required to be connected using an adhesive, which further reduces the thickness of the flexible display.

Figure 6:
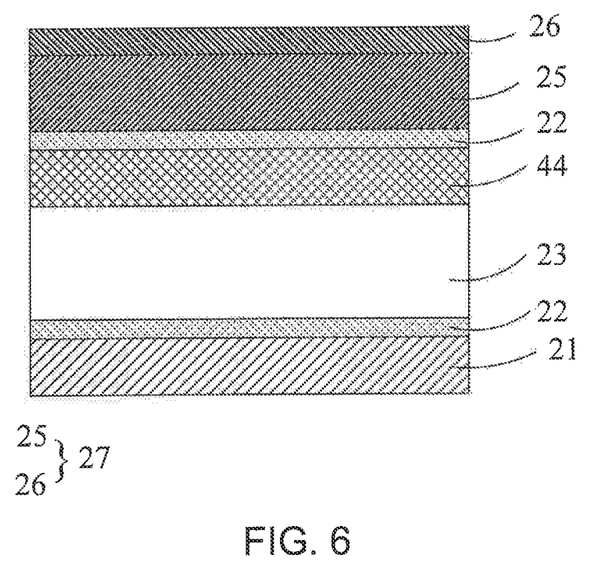
FIG. 6 is a schematic diagram of a fifth film layer of a flexible display according to an embodiment of the present disclosure.

As illustrated in FIG. 6, an embodiment of the present disclosure provides a flexible display including a back plate 21, a flexible display panel 23, a touch function member 34, a polarizing member 25, and a protective cover 26. The protective cover 26 and the polarizing member 25 are integrally disposed to form a polarizing protection member 27. The touch function member 44 is integrally disposed with the flexible display panel 23, and an adhesive 22 is disposed between the flexible display panel 23 and the back plate 21. An adhesive is disposed between the polarizing member 25 and the touch function member 44. The polarizing member and the protective cover are integrally disposed, such that an adhesive connection is not required between the polarizing member and the protective cover, thereby further reducing the thickness of the flexible display.

Figure 7:
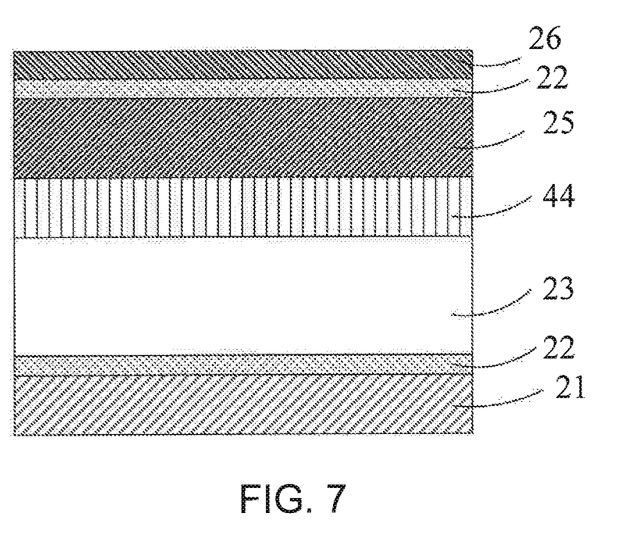
FIG. 7 is a schematic diagram of a sixth film layer of a flexible display according to an embodiment of the present disclosure.

As illustrated in FIG. 7, the embodiment of the present disclosure provides a flexible display including a back plate 21, a flexible display panel 23, a touch function member 44, a polarizing member 25, and a protective cover 26. The polarizing member 25, the touch function member 44, and the flexible display panel 23 are integrally disposed. An adhesive 22 is disposed between the flexible display panel 23 and the back plate 21, and the adhesive 22 is disposed between polarizing member 25 and the protective cover 26. The polarizing member, the touch function member, and the flexible display panel are integrally disposed, such that the polarizing member, the touch function member, and the flexible display pane are not required to be connected using an adhesive, which further reduces the thickness of The flexible display.

In one embodiment, the protective cover includes a flexible layer and a hardened layer, the polarizing member is disposed in a direction in which the flexible is away from the hardened layer or the polarizing member is disposed between the flexible layer and the hardened layer; or the protective cover includes a hardened layer, the polarizing member is disposed in a direction in which the hardened layer faces the flexible display panel.

In one embodiment, after the flexible layer of the protective cover is removed, the protective cover and the polarizing member are integrally disposed to form a polarizing protection member. A nano silver wire is coated on the polarizing member to form the touch function member, such that the protective cover, the polarizing member, and the touch function member are integrally disposed, thereby further reducing the thickness of the flexible display.

In one embodiment, on the basis of removing the flexible layer of the protective cover and integrally forming the protective cover and the polarizing member to form a polarizing protective member, metal is deposited on the flexible display panel to form an in-cell touch function member, such that the touch function member is integrated with the flexible display panel, thereby further reducing the thickness of the flexible display.

In one embodiment, the flexible layer of the protective cover is removed, a nano silver wire is coated on the flexible display panel to form the touch function member, and the polarizing member is formed on the touch function member, such that the polarizing member, the touch function member, and the flexible display panel are integrated disposed to further reduce the thickness of the flexible display.

Figure 8:
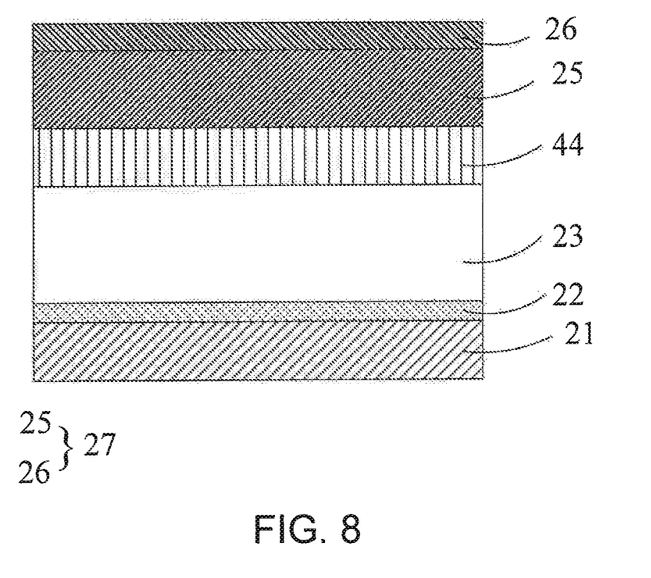
FIG. 8 is a schematic diagram of a seventh film layer of a flexible display according to an embodiment of the present disclosure.

In order to further reduce the thickness of the flexible display, as illustrated in FIG. 8, the embodiment of the present disclosure provides a flexible display including a back plate 21, a flexible display panel 23, a touch function member 44, a polarizing member 25, and a protective cover 26. An adhesive 22 is disposed between the flexible display panel 23 and the back plate 21, and the protective cover 26 is integrally provided with the polarizing member 25 to form a polarizing protection member 27. The polarizing protection member 27, the touch function member 44, and the flexible display panel 23 are integrally disposed, such that no adhesive connection is needed between the four, and the thickness of the flexible display is further reduced.

Figure 9:
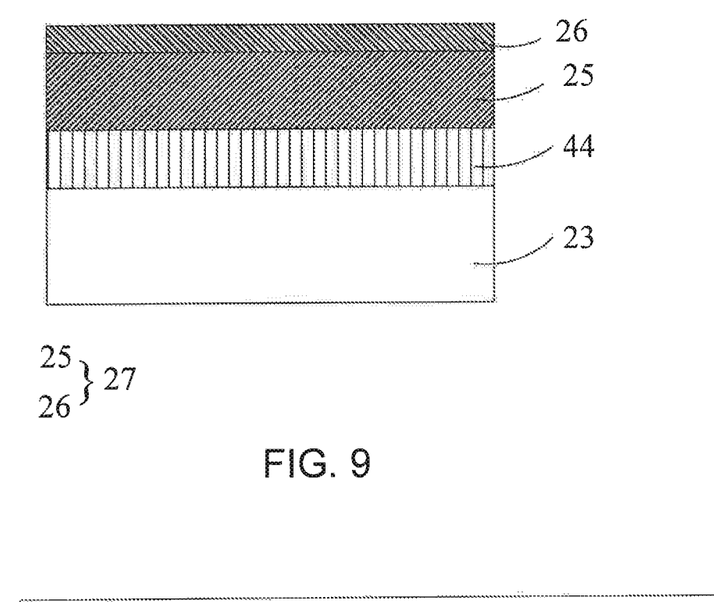
FIG. 9 is a schematic diagram of an eighth film layer of a flexible display according to an embodiment of the present disclosure.

On the basis of the above embodiments, in order to further reduce the thickness of the flexible display, as illustrated in FIG. 9, the embodiment of the present disclosure provides a flexible display, which includes a flexible display panel 23, a touch function member 44, a polarizing member 25, and a protection cover plate 26. The protection cover plate 26 is integrally provided with the polarizing member 25 to form a polarizing protection member 27. The polarizing protection member 27, the touch function member 44, and the flexible display panel 23 are integrally disposed by removing an adhesive between the back plate and the flexible display panel, which further reduces the thickness of the flexible display.

In one embodiment, the flexible substrate of the flexible display panel can be removed, and the back plate is used as a flexible substrate of the flexible display panel, and then the flexible display panel, the touch function member, the polarizing member, and the protective cover are integrally disposed to form the flexible display without an adhesive, thereby further reducing the thickness of the flexible display.

Figure 10:
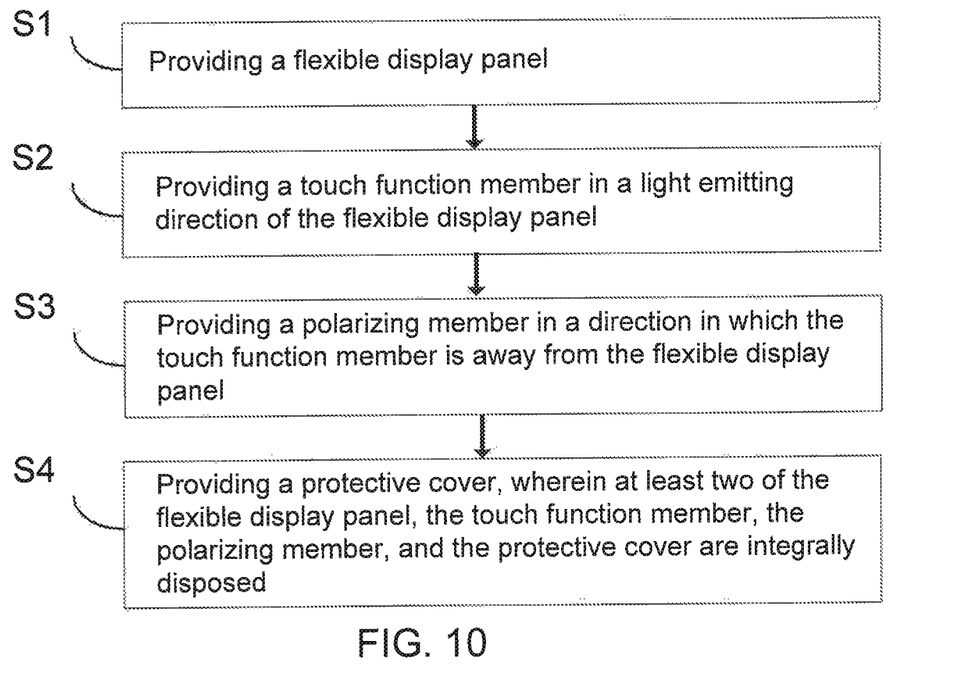
FIG. 10 is a flowchart of a method of fabricating a flexible display according to an embodiment of the present disclosure.

In an embodiment, the embodiment of the present disclosure further provides a method of fabricating a flexible display to prepare the flexible display as described above. As illustrated in FIG. 10, the method includes the following steps:

S1, providing a flexible display panel,

S2, providing a touch function member in a light emitting direction of the flexible display panel, S3, providing a polarizing member in a direction in which the touch function member is away from the flexible display panel, and S4, providing a protective cover, wherein at least two of the flexible display panel, the touch function member, the polarizing member, and the protective cover are integrally disposed.

The embodiment provides a method of fabricating a flexible display. The flexible display prepared by the method includes a flexible display panel, a touch function member, a polarizing member, and a protective cover. The touch function member is disposed on a light emitting direction of the flexible display panel. The polarizing member is disposed in a direction in which the touch function member is away from the flexible display panel. At least two of the flexible display panel, the touch function member, the polarizing member, and the protective cover are integrally disposed. The flexible display integrates at least two of the flexible display panel, the touch function member, the polarizing member, and the protective cover in the flexible display. It is not necessary to use optical glue or the like to connect components that are integrated, thereby reducing a thickness of the flexible display and alleviating a technical problem that a current display device has a large thickness.

In one embodiment, the step of providing the flexible display panel includes providing an array substrate on a flexible substrate, wherein material of the flexible substrate includes polyimide. An anode, a hole injection layer, a hole transport layer, a light-emitting layer, an electron transport layer, an electron injection layer, and a cathode are then formed on the array substrate. A thin film encapsulation is then performed to form an encapsulation layer, and finally the flexible display panel is obtained.

In one embodiment, the encapsulation layer is formed by forming an organic layer on an inorganic layer and forming an inorganic layer on the organic layer to form an inorganic/organic/inorganic three-layer structure, or the encapsulation layer is a multi-layer structure. The encapsulation layer can be formed by depositing inorganic and organic substances by chemical vapor deposition (CVD), sputtering, atomic deposition (ALD), vacuum evaporation, inkjet printing (IJP), and the like.

In one embodiment, the step of providing the polarizing protection member including selecting a colorless polyimide (CPI) as the flexible layer. A hardened layer is then formed on a surface of the flexible layer. The method of forming the hardened layer includes coating, thermal curing, and ultraviolet (UV) curing. A polarizing layer is then formed on a back side of the flexible layer, and finally the polarizing protection member is obtained.

In one embodiment, the step of preparing the polarizing protection member includes selecting the CPI as the flexible layer, forming a polarizing member on the flexible layer, forming a hardened layer on the polarizing member, and finally obtaining the polarizing protection member.

In one embodiment, the touch function member is an external touch function member, and cycloolefin polymer (COP) or polyethylene terephthalate (PET) is used as a substrate. indium tin oxide (ITO) is then deposited on the substrate and patterned to obtain the touch function member.

In one embodiment, the touch function member is an in-cell touch function member, and ITO or metal is directly deposited on the encapsulation layer of the flexible display panel to form the touch function member. A patterned structure of a sensor of the touch function member can be prepared by physical vapor deposition (PVD), CVD, etc., or the patterned structure of the sensor of the touch function member can be prepared by a metal mesh technology to obtain the touch function member.

In one embodiment, the touch function member is an in-cell touch function member, and a nano silver wire can be coated on the flexible display panel, and the nano silver wire is patterned to form a touch function member, or the nano silver wire is directly coated on the polarizer, and the nano silver wire is patterned to form the touch functional member.

In one embodiment, a polarizing member and a hardened layer are formed on the flexible layer, and then a nano silver wire is coated on a back surface of the flexible layer, and the nano silver wire is patterned to form the touch function member.

In one embodiment, the polarizing member includes a color filter (CF) and a black matrix (BM), and the preparation process of the polarizing member includes depositing the CF and the BM on the touch function member. That is, the CF corresponding to a color is deposited above corresponding red, green, and blue (RGB) pixels, the BM is filled between the CF, and finally a polarizing member is obtained.

A thickness of the current display device is 500 um. In one embodiment, the polarizing protection member is formed by integrating the polarizing member and the protective cover, such that the thickness of the polarizing protection member ranges between 70 um and 120 um. Then, by depositing ITO on COP or PET to form an external touch function member, the thickness of the touch function member ranges between 50 um and 100 um. Finally, the polarizing protection member, the touch function member, the flexible display panel, and the back plate are bonded through the adhesive to form the flexible display having a thickness of less than 400 um, thereby reducing the thickness of the flexible display.

On the basis of the above embodiments, in one embodiment, the external touch function member is changed into an in-cell touch function member, and ITO can be deposited on the flexible display panel and patterned to form the touch function member. Alternatively, a nano silver wire is coated on the polarizing member and patterned to form the touch function member. The obtained flexible display has a thickness of less than 300 um, thereby further reducing the thickness of the flexible display.

On the basis of the above embodiments, in one embodiment, the flexible layer in the protective cover is removed, and the protective cover, the polarizing member, the touch function member, and the flexible display panel are integrally disposed. The obtained flexible display has a thickness less than 200 um, thereby further reducing the thickness of the flexible display.

On the basis of the above embodiments, in one embodiment, the back plate is removed, and a polarizing member is formed on the touch function member, and a BM is formed between a CF by forming the CF having a corresponding color above corresponding RGB pixels. The polarizing member is obtained, and the obtained flexible display has a thickness of less than 100 um, thereby further reducing the thickness of the flexible display.

According to the above embodiment, the embodiment of the present disclosure provides a flexible display and a method of fabricating same. The flexible display includes a flexible display panel, a touch function member, a polarizing member, and a protective cover. The touch function member is disposed on a light emitting direction of the flexible display panel. The polarizing member is disposed in a direction in which the touch function member is away from the flexible display panel. At least two of the flexible display panel, the touch function member, the polarizing member, and the protective cover are integrally disposed. The flexible display integrates at least two of the flexible display panel, the touch function member, the polarizing member, and the protective cover in the flexible display. It is not necessary to use optical glue or the like to connect components that are integrated, thereby reducing a thickness of the flexible display and alleviating a technical problem that a current display device has a large thickness.

In the above, although the present disclosure has been disclosed in the above preferred embodiments, the preferred embodiments are not intended to limit the present disclosure, and those skilled in the art can make various modifications and refinements without departing from the spirit and scope of the present disclosure. The protected scope of the present disclosure is therefore defined by the scope of the claims.

What is claimed is:

1. A flexible display, comprising:
   a flexible display panel;
   a touch function member disposed on a light emitting direction of the flexible display panel and comprising a color filter and a black matrix;
   a polarizing member disposed in a direction in which the touch function member is away from the flexible display panel;
   a protective cover; and
   a nano silver wire;
   wherein at least two of the flexible display panel, the touch function member, the polarizing member, and the protective cover are integrally disposed;
   wherein the nano silver wire is coated on the flexible display panel to form the touch function member, and the polarizing member comprising the color filter and the black matrix is formed on the touch function member, such that the polarizing member, the touch function member, and the flexible display panel are integrated disposed, and the flexible display has a thickness of less than 300 um.

2. The flexible display according to claim 1, wherein the flexible display further comprises a back plate, and the flexible display panel is disposed on the back plate.

3. The flexible display according to claim 2, wherein the polarizing member and the protective cover are integrally disposed to form a polarizing protection member, and an adhesive is disposed between the flexible display panel and the back plate.

4. The flexible display according to claim 3, wherein the polarizing protection member comprises a polarizing layer, a hardened layer, and a flexible layer, the hardened layer is disposed in a direction in which the flexible layer is away from the flexible display panel, and the polarizing layer is formed on a surface of the flexible layer.

5. The flexible display according to claim 4, wherein the polarizing layer is formed in a direction in which the flexible layer is away from the hardened layer, or the polarizing layer is formed between the flexible layer and the hardened layer.

6. The flexible display according to claim 3, wherein the polarizing protection member comprises a polarizing layer and a hardened layer, the polarizing layer is formed on a surface of the hardened layer facing the flexible display panel.

7. The flexible display according to claim 2, wherein, an adhesive is disposed between the flexible display panel and the back plate, and an adhesive is disposed between the protective cover and the polarizing member.

8. The flexible display according to claim 2, wherein the protective cover, the polarizing member, the touch function member, the flexible display panel, and the back plate are integrally disposed.

9. The flexible display according to claim 1, wherein the polarizing protection member comprises a polarizing layer, a hardened layer, and a flexible layer, the hardened layer is disposed in a direction in which the flexible layer is away from the flexible display panel, the polarizing layer is formed in a direction in which the flexible layer is away from the hardened layer, and the touch function member is formed in a direction in which the polarizing layer is away from the hardened layer.

10. The flexible display according to claim 1, wherein the polarizing protection member comprises a polarizing layer, a hardened layer, and a flexible layer, the hardened layer is disposed in a direction in which the flexible layer is away from the flexible display panel, the polarizing layer is formed between the flexible layer and the hardened layer, and the touch function member is formed in a direction in which the flexible layer is away from the hardened layer.

11. The flexible display according to claim 1, wherein the polarizing protection member comprises a polarizing layer and a hardened layer, the polarizing layer is formed on a surface of the hardened layer facing the flexible display panel, and the touch function member is formed in a direction in which the polarizing layer is away from the hardened layer.

12. The flexible display according to claim 1, wherein the protective cover and the polarizing member are integrally disposed to form a polarizing protection member.

13. The flexible display according to claim 12, wherein the polarizing protection member comprises a polarizing layer and a hardened layer, and the polarizing layer is formed on a surface of the hardened layer facing the flexible display panel.

14. A method of fabricating a flexible display, comprising:
providing a flexible display panel;
providing a touch function member in a light emitting direction of the flexible display panel and the touch function member comprising a color filter and a black matrix;
providing a polarizing member in a direction in which the touch function member is away from the flexible display panel;
providing a nano silver wire;
providing a protective cover, wherein at least two of the flexible display panel, the touch function member, the polarizing member, and the protective cover are integrally disposed;
wherein the nano silver wire is coated on the flexible display panel to form the touch function member, and the polarizing member comprising the color filter and the black matrix is formed on the touch function member, such that the polarizing member, the touch function member, and the flexible display panel are integrated disposed, and the flexible display has a thickness of less than 300 um.

* * * * *